US006710374B2

(12) United States Patent
Wirth

(10) Patent No.: US 6,710,374 B2
(45) Date of Patent: Mar. 23, 2004

(54) LIGHT-EMITTING SEMICONDUCTOR COMPONENT

(75) Inventor: Ralph Wirth, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/324,433

(22) Filed: Dec. 20, 2002

(65) Prior Publication Data

US 2003/0116771 A1 Jun. 26, 2003

(51) Int. Cl.[7] ............................................. H01L 27/15
(52) U.S. Cl. ......................... 257/79; 257/99; 257/623; 257/10; 257/81
(58) Field of Search .......................... 257/79, 99, 623, 257/10, 81

(56) References Cited

U.S. PATENT DOCUMENTS 5,309,001 A * 5/1994 Watanabe et al. ............. 257/99
5,698,865 A * 12/1997 Gerner et al. ................ 257/94
5,861,636 A * 1/1999 Dutta et al. .................. 257/91
6,111,272 A * 8/2000 Heinen ........................ 257/94
6,518,601 B2 * 2/2003 Wirth ........................... 257/98
6,614,056 B1 * 9/2003 Tarsa et al. .................. 257/91

FOREIGN PATENT DOCUMENTS

EP            0 905 797 A2      3/1999

* cited by examiner

Primary Examiner—Nathan J. Flynn
Assistant Examiner—Kemmon R. Forde
(74) Attorney, Agent, or Firm—Laurence A. Greenberg; Werner H. Stemer; Ralph E. Locher

(57) ABSTRACT

A light-emitting semiconductor component includes a thin film stack having a front side and a rear side, a photon-emitting zone formed in an active layer, and contact points formed on the front side and rear side of the thin film stack to impress current into the active layer. The photon-emitting zone is separated physically from the contact points in the plane of the thin film stack. As a result, the absorption of the radiation at the contact points can be minimized.

25 Claims, 1 Drawing Sheet

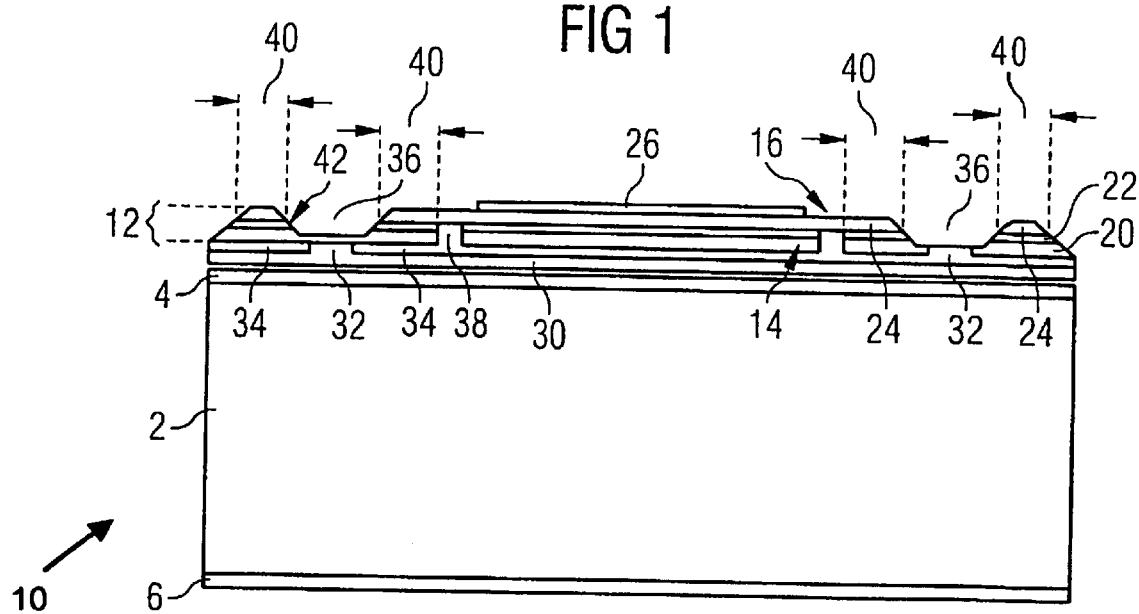
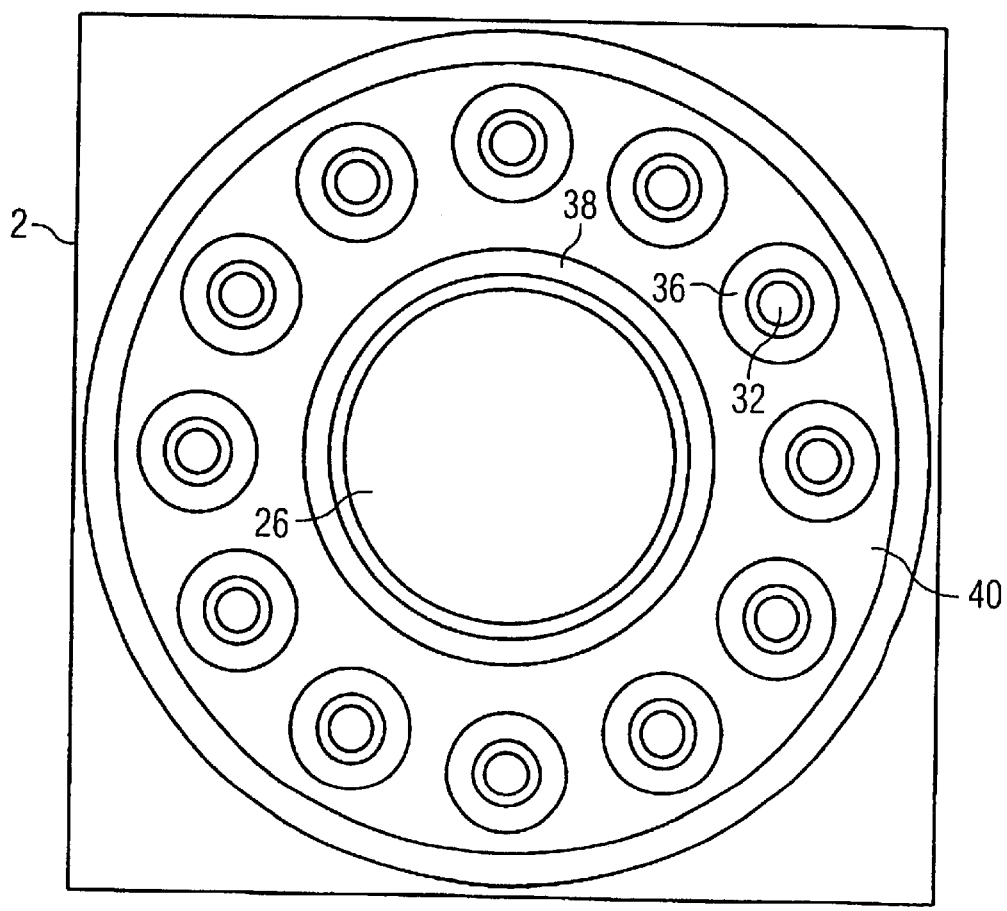

LIGHT-EMITTING SEMICONDUCTOR COMPONENT

BACKGROUND OF THE INVENTION

Field of the Invention

The invention relates to a light-emitting semiconductor component including a thin film stack having a front side, a rear side, an active layer formed with a photon-emitting zone therein, and contact points formed on the front side and rear side of the thin film stack for impressing current into the active layer.

Thin film light-emitting diodes are known, for example, from Published European Patent Application EP 0 905 797 A. The thin film principle is in this case based on internal multiple reflections, combined with internal scattering of the light rays. In this case, the designation "thin" relates in functional terms to the optical thickness of the light-emitting diode. Between two scattering reflections, the absorption suffered by a light ray should be as low as possible.

SUMMARY OF THE INVENTION

It is accordingly an object of the invention to further reduce the light absorption in generic light-emitting semiconductor components and in this way to increase the external efficiency of the component.

With the foregoing and other objects in view there is provided, in accordance with the invention, a light-emitting semiconductor component including: a thin film stack having a front side and a rear side, the film stack including an active layer formed with a photon-emitting zone; and a plurality of contact points for impressing current into the active layer, the plurality of the contact points formed on the front side and the rear side. The photon-emitting zone is separated physically from the plurality of the contact points.

In accordance with an added feature of the invention, the active layer is formed with interruptions physically separating the photon-emitting zone from the plurality of the contact points.

In accordance with an additional feature of the invention, the film stack is formed with a plurality of cutouts interrupting the active layer in regions above ones of the plurality of the contact points on the rear side.

In accordance with another feature of the invention, the film stack includes a plurality of regions adjoining the plurality of the cutouts; and the plurality of the regions are formed with at least partly oblique flanks for scattering light.

In accordance with a further feature of the invention, the film stack is formed with a cutout interrupting the active layer in a region around one of the plurality of the contact points on the front side.

In accordance with a further added feature of the invention, the film stack includes a region adjoining the cutout; and the region is formed with at least partly oblique flanks for scattering light.

In accordance with a further additional feature of the invention, a sheathing layer electrically connects the photon-emitting zone to the plurality of the contact points.

In accordance with another added feature of the invention, the sheathing layer has a thickness; and a ratio of the distance between the photon-emitting zone and the nearest one of the plurality of the contact points to the thickness of the sheathing layer is between 1 and 20, inclusive, and even more preferably is between 1 and 10, inclusive.

In accordance with another further feature of the invention, the rear side has a total area; and ones of the plurality of the contact points that are on the rear side assume an area of 2% to 25% of the total area of the rear side, and even more preferably assume an area of 5% to 15% of the total area of the rear side.

In accordance with an added feature of the invention, ones of the plurality of the contact points on the rear side are a plurality of mutually spaced apart contact points.

In accordance with an additional feature of the invention, one of the plurality of the contact points is formed on the front side and defines a central middle contact point.

In accordance with another feature of the invention, ones of the plurality of the contact points on the rear side are a plurality of mutually spaced apart contact points; one of the plurality of the contact points is formed on the front side and defines a central middle contact point; and the plurality of the mutually spaced apart contact points on the rear side are configured on a circumference of a circle and are concentrically configured with respect to the middle contact point on the front side.

In accordance with a further feature of the invention, a highly reflective mirror layer is configured on the rear side, except for locations of ones of the plurality of the contact points on the rear side.

In accordance with a further added feature of the invention, there is provided, a first sheathing layer having a roughened front side. The first sheathing layer is formed on the front side of the film stack, at least in the photon-emitting zone.

In accordance with a further additional feature of the invention, there is provided, a second sheathing layer having a roughened rear side. The second sheathing layer is formed on the rear side of the film stack, at least in the photon-emitting zone.

In accordance with another added feature of the invention, the film stack has a thickness between 3 $\mu$m and 50 $\mu$m.

In accordance with another further added feature of the invention, the film stack has a thickness between 5 $\mu$m and 25 $\mu$m.

In accordance with yet an added feature of the invention, the film stack has a layer sequence based on $Al_xGa_yIn_{1-x-y}P$, with $0 \leq x \leq 1$, $0 \leq y \leq 1$ and $x+y \leq 1$.

In accordance with yet an additional feature of the invention, the film stack includes sheathing layers with material originating from the $Al_xGa_{(1-x)}As$ material system, with $0 \leq x \leq 1$.

In accordance with yet another feature of the invention, the active layer is configured between the sheathing layers; and the active layer has material that originates from a material system described by a general formula $Al_xGa_yIn_{1-x-y}P$, with $0 \leq x \leq 1$, $0 \leq y \leq 1$ and $x+y \leq 1$.

In accordance with yet a further feature of the invention, the film stack has a layer sequence based on $Al_xGa_{(1-x)}As$ with $0 \leq x \leq 1$.

In accordance with yet a further added feature of the invention, the film stack has layers defining planes running through the film stack and through the plurality of the contact points.

With the foregoing and other objects in view there is also provided, in accordance with the invention, an infrared-emitting luminescent diode including: a thin film stack having a front side and a rear side, the film stack including an active layer formed with a photon-emitting zone; and a plurality of contact points for impressing current into the active layer. The plurality of the contact points are formed on the front side and the rear side, and the photon-emitting zone is separated physically from the plurality of the contact points.

According to the invention, in a light-emitting semiconductor component of the type mentioned at the beginning, the photon-emitting zone is arranged physically separated from the contact points in the plane of the thin film stack.

The invention is therefore based on the idea of physically separating the electric contact points and the light-producing areas to keep the light produced in the active zone away from the contact points. Since the contact points with their typical reflectivity of only about 30% contribute substantially to the absorption of the radiation propagating in the thin film stack, the intended aim of reducing the overall absorption is achieved as a result.

In a preferred refinement, the photon-emitting zone is separated physically from the contact points by interruptions in the active layer.

In particular, the thin film stack can advantageously have cutouts interrupting the active layer in a region above the rear-side contact points.

Likewise, the thin film stack can advantageously have cutouts interrupting the active layer in a region around the upper side contact points.

As a result of interrupting the active layer, the cutouts have the effect of physically separating the light-producing zone from the contact points of the upper or rear side of the film thin stack.

The regions of the thin film stack that adjoin the cutouts preferably have at least partly oblique flanks to scatter light. As a result, the scattering processes needed for the thin film light-emitting diode are already made possible by the etching process required to produce the cutouts. An additional process step can be dispensed with.

However, the scattering processes can be introduced in another way, in particular by providing a first sheathing layer with a roughened front side formed on the upper side of the thin film stack, at least in the photon-emitting zone. Alternatively or additionally, a second sheathing layer with a roughened rear side can be formed on the rear side of the thin film stack, at least in the photon-emitting zone.

The photon-emitting zone is expediently connected electrically to the contact points via a sheathing layer. This ensures the electrical contact for feeding current into the active layer. At the same time, the propagation of the radiation produced in the photon-emitting zone is low over the comparatively thin sheathing layer.

The ratio of the distance of the photon-emitting zone from the nearest contact point to the thickness of the electrically connected sheathing layer is advantageously between and including 1 and 20, and even more preferably between and including 1 and 10.

In a preferred refinement, the proportion of the contact points applied to the rear side of the thin film stack assumes an area of 2% to 25%, and even more preferably an area of 5% to 15%, of the total area of the rear side.

In this case, the contact points applied to the rear size of the thin film stack can be formed as a plurality of mutually spaced contact points.

The contact points applied to the front side of the thin film stack can in particular be formed by a central middle contact point.

In a particularly preferred refinement, the contact points of the rear side are arranged on the circumference of a circle and are concentrically arranged with respect to a middle contact point of the front side.

The rear side of the thin film stack, with the exception of the area of the contact points, is expediently provided with a highly reflective mirror layer, which for example, consists of a dielectric such as SiN, $SiO_2$ or the like and a metallization such as Au, Ag, Al or the like.

The thin film stack preferably has a thickness between 3 $\mu$m and 50 $\mu$m, and even more preferably between 5 $\mu$m and 25 $\mu$m.

In an expedient refinement, the thin film stack has a layer sequence based on $Al_xGa_yIn_{1-x-y}P$, where $0 \leq x \leq 1$, $0 \leq y \leq 1$ and $x+y \leq 1$. The material of the sheathing layers in this configuration can alternatively originate from the $Al_xGa_{(1-x)}$As material system. Likewise, the inventive arrangement can also be used for thin film stacks wholly based on the $Al_xGa_{(1-x)}$As material system, such as for infrared-emitting luminescent diodes.

Other features which are considered as characteristic for the invention are set forth in the appended claims.

Although the invention is illustrated and described herein as embodied in a light-emitting semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic cross-sectional view of a first exemplary embodiment of a light-emitting semiconductor component;

FIG. 2 is a schematic plan view of the semiconductor component shown in FIG. 1, which shows rear side contact points.

DESCRIPTION OF THE PREFERRED EMBODIMENTS

Referring now to the figures of the drawing in detail and first, particularly, to FIG. 1 thereof, there is schematically shown a cross sectional view through a thin film light-emitting diode 10 including a thin film stack 12, which is fitted to a conductive carrier substrate 2 provided with metal contacts 4, 6. The electrical and mechanical connection of the thin film stack 12 to the carrier substrate 2 is produced in a manner known per se, and will therefore not be described further below.

The thin film stack 12 contains a p-doped first sheathing layer 20, which for example, has AlGaInP or AlGaAs, an active layer 22, which for example, has AlGaInP, and an n-doped second sheathing layer 24, which for example, has AlGaInP or AlGaAs. The conductivity types of the first and second sheathing layer can also be interchanged.

The first and second sheathing layer 20, 24 and the active layer 22 can in this case be both individual layers and formed from a plurality of part layers, in particular of the same conductivity type, but of different material compositions.

Fitted to the front side 16 of the second sheathing layer 24 is a central middle contact 26, which in the exemplary embodiment, represents the n contact of the light-emitting diode, and for example, can be fabricated from a conventional metallic material suitable for this purpose. Electrical contact with the p side is made via the metal layers 6 and 4 of the conductive carrier substrate 2, which for example, can again be fabricated from conventional metallic materials suitable for the purpose. A p contact layer of the thin film stack has a continuous contact layer 30, which is connected electrically to the metal layer 4 applied to the front side of the carrier substrate 2 and can also be fabricated from a conventional suitable metallic material.

However, current is not fed into the active layer over the entire area of the contact layer 30, but only at specific alloyed contact points 32. As can best be seen in FIG. 2, the total area of the alloyed contact points 32 occupies only a small part of the base area of the light-emitting diode. In the exemplary embodiment, the contact points 32 have, for example, a proportion of 5% of the base area. Other proportions however, in the range from about 3% to about 15% also supply good or very good results.

The region of the rear side 14 of the thin film stack 12 in which no contact points 32 are alloyed is occupied by a highly reflective, non-alloyed mirror 34. This can consist, for example, of a dielectric such as SiN, $SiO_2$ or the like and a metallization such as Au, Ag, Al or the like.

The contact points 32 are arranged on the rear side 14 spaced apart from one another on the circumference of a circle concentrically with respect to the middle contact of the front side 16.

In a region above the contact points 32, in each case the second sheathing layer 24 and the active layer 22 are removed, for example by etching, so that cutouts 36 are produced in the thin film stack. As FIG. 1 shows, the first sheathing layer 20 is also thinned. However, care must be taken here that the remaining residual thickness of the sheathing layer 20 is still sufficient to permit subsequent alloying of the contact points 32. In addition, a sufficiently high transverse conductivity must remain in order to carry the current into the adjacent zone 40 producing photons. In this case, a remaining residual thickness of the sheathing layer 20 of about 1 $\mu$m has proven to be adequate for the AlGaInP/AlGaAs material system.

As a result of removing the second sheathing layer 24 and the active layer 22 over the contact points 32, the production of light over the contact points 32 is prevented. The light produced in the zones 40 producing photons can then penetrate into the areas of the contact points 32 only over the residual height of the first sheathing layer 20, and is therefore drastically reduced. The undesired absorption at the contact points 32 of the light produced is therefore also significantly suppressed.

In the regions 40 of the thin film stack that adjoin the cutouts 36, photons are produced in the active layer 22 in a conventional way and are coupled out directly or after internal scatter as useful radiation from the light-emitting diode.

In order also to minimize the light absorption at the front side middle contact point 26, an annular cutout 38 is introduced into the thin film stack 12 by etching the active layer 22 and the first sheathing layer 20. As a result, the zone 40 producing photons is also physically separated from the contact point 26.

If the second sheathing layer 24 is the sheathing layer with the higher transverse conductivity, which is the case in the exemplary embodiment because of the n-doping of the second sheathing layer, and if this layer is not severed, then somewhat further physical separation, in particular a multiple of the thickness of the first sheathing layer 20, which has a lower transverse conductivity as a p-doped layer, may be sufficient to ensure that the light is produced at a sufficient distance from the contact point 26. In this case, the physical separation can preferably be at least 5 times to 20 times the thickness of the first sheathing layer 20.

The internal scattering processes needed for the thin film light-emitting diode are provided in the exemplary embodiment by the oblique flanks 42 of the cutouts 36. However, alternatively or additionally, they can also be produced by other methods, such as a roughened front side 16 of the second sheathing layer 24 or a roughened rear side 14 of the first sheathing layer 20.

I claim:

1. A light-emitting semiconductor component, comprising:

a thin film stack having a front side and a rear side, said film stack including an active layer formed with a photon-emitting zone; and a plurality of contact points for impressing current into said active layer;

said plurality of said contact points formed on said front side and said rear side; and said photon-emitting zone being separated physically from said plurality of said contact points.

2. The light-emitting semiconductor component according to claim 1, wherein said active layer is formed with interruptions physically separating said photon-emitting zone from said plurality of said contact points.

3. The light-emitting semiconductor component according to claim 1, wherein said film stack is formed with a plurality of cutouts interrupting said active layer in regions above ones of said plurality of said contact points on said rear side.

4. The light-emitting semiconductor component according to claim 3, wherein said film stack includes a plurality of regions adjoining said plurality of said cutouts; and said plurality of said regions are formed with at least partly oblique flanks for scattering light.

5. The light-emitting semiconductor component according to claim 1, wherein said film stack is formed with a cutout interrupting said active layer in a region around one of said plurality of said contact points on said front side.

6. The light-emitting semiconductor component according to claim 5, wherein said film stack includes a region adjoining said cutout; and said region is formed with at least partly oblique flanks for scattering light.

7. The light-emitting semiconductor component according to claim 1, comprising a sheathing layer electrically connecting said photon-emitting zone to said plurality of said contact points.

8. The light-emitting semiconductor component according to claim 7, wherein:

said sheathing layer has a thickness; and a ratio of a distance between said photon-emitting zone and a nearest one of said plurality of said contact points to said thickness of said sheathing layer is between 1 and 20, inclusive.

9. The light-emitting semiconductor component according to claim 7, wherein:

said sheathing layer has a thickness; and a ratio of a distance between said photon-emitting zone and a nearest one of said plurality of said contact points to said thickness of said sheathing layer is between 1 and 10, inclusive.

10. The light-emitting semiconductor component according to claim 1, wherein:
said rear side has a total area; and
ones of said plurality of said contact points on said rear side assume an area of 2% to 25% of said total area of said rear side.

11. The light-emitting semiconductor component according to claim 1, wherein:
said rear side has a total area; and
ones of said plurality of said contact points on said rear side assume an area of 5% to 15% of said total area of said rear side.

12. The light-emitting semiconductor component according to claim 1, wherein ones of said plurality of said contact points on said rear side are a plurality of mutually spaced apart contact points.

13. The light-emitting semiconductor component according to claim 1, wherein one of said plurality of said contact points is formed on said front side and defines a central middle contact point.

14. The light-emitting semiconductor component according to claim 1, wherein:
ones of said plurality of said contact points on said rear side are a plurality of mutually spaced apart contact points;
one of said plurality of said contact points is formed on said front side and defines a central middle contact point; and
said plurality of said mutually spaced apart contact points on said rear side are configured on a circumference of a circle and are concentrically configured with respect to said middle contact point on said front side.

15. The light-emitting semiconductor component according to claim 1, comprising a highly reflective mirror layer configured on said rear side, except for locations of ones of said plurality of said contact points on said rear side.

16. The light-emitting semiconductor component according to claim 1, comprising:
a first sheathing layer having a roughened front side;
said first sheathing layer formed on said front side of said film stack, at least in said photon-emitting zone.

17. The light-emitting semiconductor component according to claim 1, comprising:
a second sheathing layer having a roughened rear side;
said second sheathing layer formed on said rear side of said film stack, at least in said photon-emitting zone.

18. The light-emitting semiconductor component according to claim 1, wherein said film stack has a thickness between 3 $\mu$m and 50 $\mu$m.

19. The light-emitting semiconductor component according to claim 1, wherein said film stack has a thickness between 5 $\mu$m and 25 $\mu$m.

20. The light-emitting semiconductor component according to claim 1, wherein said film stack has a layer sequence based on $Al_xGa_yIn_{1-x-y}P$, with $0 \leq x \leq 1$, $0 \leq y \leq 1$ and $x+y \leq 1$.

21. The light-emitting semiconductor component according to claim 1, wherein said film stack includes sheathing layers with material originating from a $Al_xGa_{(1-x)}As$ material system, with $0 \leq x \leq 1$.

22. The light-emitting semiconductor component according to claim 21, wherein:
said active layer is configured between said sheathing layers; and
said active layer has material that originates from a material system described by a general formula $Al_xGa_yIn_{1-x-y}P$, with $0 \leq x \leq 1$, $0 \leq y \leq 1$ and $x+y \leq 1$.

23. The light-emitting semiconductor component according to claim 1, wherein said film stack has a layer sequence based on $Al_xGa_{(1-x)}As$ with $0 \leq x \leq 1$.

24. The light-emitting semiconductor component according to claim 1, wherein said film stack has layers defining planes running through said film stack and through said plurality of said contact points.

25. An infrared-emitting luminescent diode, comprising:
a thin film stack having a front side and a rear side, said film stack including an active layer formed with a photon-emitting zone; and
a plurality of contact points for impressing current into said active layer;
said plurality of said contact points formed on said front side and said rear side; and
said photon-emitting zone being separated physically from said plurality of said contact points.

* * * * *

UNITED STATES PATENT AND TRADEMARK OFFICE
CERTIFICATE OF CORRECTION

PATENT NO.   : 6,710,374 B2
DATED        : March 23, 2004
INVENTOR(S)  : Ralph Wirth It is certified that error appears in the above-identified patent and that said Letters Patent is hereby corrected as shown below:

<u>Title page,</u>
Item [30], should read as follows: -- Dec. 20, 2001     (DE)    ......... 101 62 914 --

Signed and Sealed this

Twenty-sixth Day of October, 2004

JON W. DUDAS
*Director of the United States Patent and Trademark Office*

UNITED STATES PATENT AND TRADEMARK OFFICE
CERTIFICATE OF CORRECTION

PATENT NO.    : 6,710,374 B2
DATED         : March 23, 2004
INVENTOR(S)   : Ralph Wirth It is certified that error appears in the above-identified patent and that said Letters Patent is hereby corrected as shown below:

<u>Title page,</u>
Item [30], Foreign Application Priority Data, should read as follows:
-- Dec. 20, 2001      (DE)      ………. 101 62 914 --

Signed and Sealed this

Eighth Day of February, 2005

JON W. DUDAS
*Director of the United States Patent and Trademark Office*